US011121277B2

(12) United States Patent
Palm (10) Patent No.: US 11,121,277 B2
(45) Date of Patent: Sep. 14, 2021

(54) SOLAR MODULE WITH HOMOGENEOUS COLOR IMPRESSION

(71) Applicant: (CNBM) BENGBU DESIGN & RESEARCH INSTITUTE FOR GLASS INDUSTRY CO., LTD, Bengbu (CN)

(72) Inventor: Joerg Palm, Munich (DE)

(73) Assignee: (CNBM) BENGBU DESIGN & RESEARCH INSTITUTE FOR GLASS INDUSTRY CO., LTD, Bengbu (CN)

( * ) Notice: Subject to any disclaimer, the term of this patent is extended or adjusted under 35 U.S.C. 154(b) by 0 days.

(21) Appl. No.: 16/970,901

(22) PCT Filed: Feb. 19, 2019

(86) PCT No.: PCT/CN2019/075419
§ 371 (c)(1),
(2) Date: Aug. 18, 2020

(87) PCT Pub. No.: WO2019/161762
PCT Pub. Date: Aug. 29, 2019

(65) Prior Publication Data
US 2020/0388716 A1    Dec. 10, 2020

(30) Foreign Application Priority Data

Feb. 23, 2018 (EP) .................................... 18158484

(51) Int. Cl.
*H01L 31/055* (2014.01)
*H01L 31/18* (2006.01)
(Continued)

(52) U.S. Cl.
CPC ........ *H01L 31/055* (2013.01); *H01L 31/0488* (2013.01); *H01L 31/18* (2013.01); *H02S 20/26* (2014.12)

(58) Field of Classification Search
CPC ... H01L 31/055; H01L 31/0488; H01L 31/18; H02S 20/26
See application file for complete search history.

(56) References Cited

U.S. PATENT DOCUMENTS 8,772,078 B1   7/2014 Farris, III
2010/0062560 A1   3/2010 Farris, III et al.
(Continued)

FOREIGN PATENT DOCUMENTS

CN   104718628 A   6/2015
WO   2007/071703 A1   6/2007
(Continued)

OTHER PUBLICATIONS

International Search Report for international Application No. PCT/CN2019/075419 filed on Feb. 19, 2019 on behalf of Bengbu Design & Research Institute Ltd. dated Apr. 28, 2019. 4 pages.
(Continued)

*Primary Examiner* — Jayne L Mershon
(74) *Attorney, Agent, or Firm* — Bayramoglu Law Offices LLC (57) ABSTRACT

A solar module with solar cells comprising a front covering with an outer and an inner surface and further comprising optically active zones with a first color, and optically inactive zones having a second color different from the first color. The front covering having a first dot grid covering the optically active zones, the first dot grid having a large number of opaque colored dots that have a third color different from the first color, wherein addition of the first color and the third color yields an additive color. The front
(Continued)

covering having a second dot grid covering a optically inactive zone, the second dot grid having opaque colored dots having a fourth color different from the second color, wherein addition of the second color and the fourth color yields an additive color, wherein the third color and the fourth color are selected for a calculated color deviation.

16 Claims, 3 Drawing Sheets

(51) Int. Cl.
    *H02S 20/26*     (2014.01)
    *H01L 31/048*     (2014.01)

(56) References Cited

U.S. PATENT DOCUMENTS

| | | |
|---|---|---|
| 2012/0298194 A1 | 11/2012 | Hergert et al. |
| 2016/0049904 A1* | 2/2016 | Sasaki .................. H01G 9/2068 136/251 |
| 2017/0085216 A1 | 3/2017 | Balasubramanian et al. |

FOREIGN PATENT DOCUMENTS

| | | |
|---|---|---|
| WO | 2011/036209 A1 | 3/2011 |
| WO | 2014/045142 A1 | 3/2014 |

OTHER PUBLICATIONS

Written Opinion for International Application No. PCT/CN2019/075419 filed on Feb. 19, 2019 on behalf of Bengbu Design & Research Institute Ltd. dated Apr. 28, 2019. 4 pages.

* cited by examiner

SOLAR MODULE WITH HOMOGENEOUS COLOR IMPRESSION

CROSS-REFERENCE TO RELATED APPLICATIONS

The present application is the U.S. National Stage of International Patent Application No. PCT/CN2019/075419 filed on Feb. 19, 2019 which, in turn, claims priority to European Patent Application No. EP 18158484.8 filed on Feb. 23, 2018.

The present invention is in the technical area of photovoltaic energy generation and relates to a solar module with a homogeneous color impression. The invention further relates to a method for producing the solar module according to the invention as well as its use.

In open-space systems, large growth in solar modules can be observed; however, applications in the building-integrated setting are currently still moving in a much smaller scale. In light of intensified efforts toward decentralized energy solutions, a real demand is developing for the use of solar modules as integrated components of building envelopes, for example, as façade elements, windows, or roof elements. Other areas of application for solar modules are noise abatement walls (roadway, railway), privacy barriers in the outdoors, or walls for greenhouses. This new application makes completely new demands on solar modules, in particular in terms of aesthetics, service life, and other functionalities, such as sealing and thermal insulation. In particular, solar modules should be available in various shapes, sizes, and colors and give the most homogeneous color impression possible. Here, there are, however, technical problems that conflict with the actual functionality of the solar modules, namely, the generation of electrical power from sunlight.

An ideal solar module, in terms of efficiency optimization, would be a black body that completely absorbs the incident electromagnetic radiation in order to optimally convert the incident radiant energy into electrical energy. However, incident radiation is reflected from every actual body and absorbed radiation is re-emitted, with the color impression basically created in the human eye by the spectrally selected reflection and the re-emission of visible light. The solar spectrum has, in the visible spectral range, the highest energy intensity and the human eye has the greatest sensitivity. When a solar module is designed colored, in other words, when a color impression that differs from the ideal black body is intended to be produced in the human eye, the intensity of the light absorbed in the optically active semiconductor and thus the the electrical output or the efficiency of the solar module is necessarily reduced.

On the other hand, a solar module generally does not have, due to its design, an optically homogeneous surface on the side facing the incident light; in other words, the surface of the solar module gives no homogeneous color impression. Thus, in the case of silicon wafer modules, one sees the wafers, the busbars, often a frame, and the area between the wafers. In contrast, thin-film solar modules are typically more uniform in their color impression; however, there are, particularly in the edge region of the thin-film solar module, technology-related details, such as metallic busbars, edge decoating, and/or edge sealing, that can deviate from the color impression of the optically active areas. In addition, the patterning lines of the monolithically serially connected solar cells can be discerned. In the case of thin-film solar modules, the optically active cell region is usually black, anthracite gray, or provided with residual color tones of dark blue and green. In the case of silicon wafer modules, the optically active cell region is usually blue.

For solving this problem, WO 2007/071703 A1 presents a thin-film solar module, wherein an opaque covering of the front glass is provided in the edge region. The covering is realized by a paint applied on the front glass, a paint applied by screenprinting, or a modification of the front glass, for example, by a pigment. Covering is also possible by means of a tape applied on the front glass. To be sure, the various structures in the edge region are satisfactorily covered by the opaque covering; however, there is no homogeneous color impression over the complete solar module, since, generally speaking, the color impression of the optically active areas deviates from the color of the covering and there is thus a sharp contrast with the edge region.

Moreover, in the prior art, various methods are known for giving a certain color to a surface. Thus, for example, WO 2014/045142 A1 presents an arrangement wherein interference layers that reflect a certain spectral range of the incident light are implemented on a front glass. However, the production of such layers is technically complex and expensive. Known from WO 2011/036209 A1 is the colored design of the front electrode by suitable interference layers. Common to these approaches is the fact that they present a certain directional dependency of the color impression. Also, a contrast between photovoltaically active and inactive zones is clearly discernible. Moreover, only a limited selection of colors is available.

In contrast, the object of the present invention consists in advantageously providing solar modules known in the prior art with a homogeneous color impression over the entire module, wherein, in particular, there should be no sharp contrast between optically active and optically inactive areas. The homogeneous color impression should be realizable with the least possible loss of efficiency and low directional dependency. Additionally, the solar modules should be economically and efficiently producible in industrial series production using conventional methods.

These and other objects are accomplished according to the proposal of the invention by a solar module and a method for its production according to the coordinate claims. Advantageous embodiments of the invention are indicated by the features of the dependent claims.

Presented according to the invention is a solar module with solar cells electrically connected in series for photovoltaic energy generation. In principle, the solar module according to the invention can be any type of solar module, in particular, a wafer-based, silicon-based solar module or a thin-film solar module with monolithically integrated series-connected solar cells.

Preferably, the solar module according to the invention is a thin-film solar module. Advantageously, the solar module is a thin-film solar module with a composite pane structure that has a front covering and a back substrate (e.g., glass plates) that are fixedly bonded to one another by a thermoplastic intermediate layer (e.g., a PVB layer). The invention refers to a thin-film solar module in substrate configuration, wherein the layer structure for producing the solar cells is applied on a surface of a back substrate facing the light-entry side. The invention equally refers to a thin-film solar module in superstrate configuration, wherein the layer structure is applied on a surface of a front (transparent) covering facing away from the light-entry side.

In keeping with the customary usage, the term "thin-film solar module" refers to modules having a layer structure with a low thickness of, for example, a few microns, which require a substrate for adequate mechanical stability. The substrate can be made, for example, of inorganic glass, plastic, metal, or a metal alloy and can be designed, depending on the respective layer thickness and the specific material properties, as a rigid plate or a flexible film.

In its design as a thin-film solar module, in a manner known per se, the layer structure comprises a back electrode layer, a front electrode layer, and a photovoltaically active absorber layer arranged between the back electrode layer and the front electrode layer. The front electrode layer is optically transparent since passage of light to the layer structure must be enabled. The optically transparent front electrode layer typically includes or is made of a doped metal oxide (TCO=transparent conductive oxide), for example, n-conductive, in particular aluminum-doped, zinc oxide (AZO).

The photovoltaically active absorber layer preferably includes or is made of a chalcopyrite semiconductor, advantageously a ternary I-III-VI-compound semiconductor from the group copper indium/gallium disulfide/diselenide (Cu(In,Ga)(S,Se)$_2$). In the above formula, indium and gallium each can be present alone or in combination. The same is true for sulfur and selenium, each of which can be present alone or in combination. Particularly suitable as material for the absorber layer is CIS (copper indium diselenide/disulfide or CIGS (copper indium gallium diselenide, copper indium gallium disulfide, copper indium gallium disulfoselenide). The absorber layer typically has doping of a first conductor type (charge carrier type) and the front electrode has doping of the opposite conductor type (charge carrier type). Generally speaking, the absorber layer is p-conductive (p-doped), i.e., has an excess of defect electrons (holes) and the front electrode layer is n-conductive (n-doped) such that free electrons are present in excess. A buffer layer is typically arranged between the absorber layer and the front electrode layer. This is true in particular for absorber layers based on Cu(In,Ga)(S,Se)$_2$, with which, generally speaking, a buffer layer is required between a p-conductive Cu(In,Ga)(S,Se)$_2$ absorber layer and an n-conductive front electrode. According to current understanding, the buffer layer enables electronic adaptation between the absorber and the front electrode. Moreover, it offers protection against sputtering damage in a subsequent process step of deposition of the front electrode, for example, by DC magnetron sputtering. By means of the succession of an n-conductive front electrode layer, a buffer layer, and a p-conductive absorber layer, a p-n-heterojunction is formed, in other words, a junction between layers of the opposite conductor type. The photovoltaically active absorber layer can also be made, for example, of cadmium telluride (CdTe).

In the thin-film solar module according to the invention, serially connected solar cells are formed by patterning zones. Thus, at least the back electrode layer is subdivided by first patterning lines (P1-lines) into sections completely separated from one another, which sections form the back electrodes of the solar cells. Also, at least the absorber layer is subdivided by second patterning lines (P2-lines) into sections completely separated from one another, which sections form the absorbers of the solar cells, and at least the front electrode layer is subdivided by third patterning lines (P3-lines) into sections completely separated from one another, which sections form the front electrodes of the solar cells. Adjacent solar cells are electrically connected to one another in serial connection via electrically conductive material in the second patterning lines, wherein the front electrode of one solar cell is electrically connected to the back electrode of the adjacent solar cell and, typically, but not mandatorily, makes direct physical contact therewith.

Each patterning zone comprises a direct succession of the three patterning lines P1-P2-P3, in this order in each case. Each patterning zone is an optically inactive zone.

In keeping with the customary usage, the term "solar cell" refers to a region of the layer structure that has a front electrode, a photovoltaically active absorber, and a back electrode and is delimited by two patterning zones directly adjacent one another. This applies analogously in the edge region of the module, wherein, instead of a patterning zone, there is a connection section for electrically contacting the serial connection of the solar cells such that the solar cell is defined by the layer region with a front electrode, an absorber, and a back electrode, which is situated between a patterning zone and the directly adjacent connection section. Each solar cell has an optically active zone that comprises, arranged one atop another in the form of a stack, a back electrode, an absorber, and a front electrode and is capable of photoelectric conversion of light into electric current.

The solar module according to the invention has an inner region that comprises the solar cells with optically active cell areas and optically inactive patterning zones and an optically inactive edge region that surrounds the inner region. In the edge region, the layer structure is either removed or not deposited. In addition, usually, an edge seal is situated there as well as metallic busbars for the electrical contacting of the solar cells.

The solar module according to the invention includes in any case a light-entry-side or front transparent covering, in particular, a plate-shaped rigid covering, preferably a rigid glass plate. The front covering has, in the form of a rigid plate, no curvature and is flat (planar). In the form of a flexible covering, it can be provided in a planar form. The front covering has an outer surface facing the external surroundings and an inner surface facing the solar cells.

In the context of the present invention, the term "transparency" or "transparent" refers to visible-light transmittance of at least 85%, in particular at least 90%, preferably at least 95%, in particular 100%. Typically, visible-light is in the wavelength range from 380 nm to 780 nm. The term "opacity" or "opaque" refers to visible-light transmittance of less than 5%, in particular 0%. The percentage data refer to the intensity of the light measured on the module-interior side of the front covering, based on the intensity of the light striking the front covering from the external surroundings. The transparency of the covering can be determined in a simple manner using a measurement arrangement, wherein, for example, a white light source (source for visible light) is arranged on one side of the front covering and a detector for visible light is arranged on the other side of the front covering.

The solar module according to the invention includes optically active zones (cell areas) that can absorb incident light and generate (photo-)electric current as well as optically inactive zones that are not capable of absorbing incident light and generating (photo-)electrons. Optically inactive are, in particular, the edge region of the solar module as well as, in the case of thin-film solar cells, the patterning zones for integrated serial connection of the solar cells. In the case of silicon wafer modules, the region between the wafers is, in particular, optically inactive.

The solar module according to the invention has at least two colors different from one another. The optically active zones of the solar cells (cell areas) typically have substantially the same color, which is a first color $F_1$ having the color coordinates $L^*_1, a^*_1, b^*_1$. The index "1" in the color coordinates refers to the first color $F_1$. The optically inactive zones have at least one second color $F_2$ different from the first color $F_1$ and having the color coordinates $L*_2$, $a*_2$, $b*_2$. The optically inactive zones can, in particular, have a plurality of colors different from one another, which, in each case, are different from the first color $F_1$. The index "2" in the color coordinates refers to the second color $F_2$.

As used here and in the following, the color coordinates of the colors refer to the colors of the (CIE)L*a*b* color space known per se to the person skilled in the art, in which all perceivable colors are defined exactly. The color space is specified in the European Standard EN ISO 11664-4 "Colorimetry—Part 4:CIE 1976 L*a*b* Colour Space". Reference is made here to this standard in its entirety. In this color space, each color is defined by a color space with the three Cartesian coordinates L*, a*, b*. Green and red are opposite one another on the a*-axis; the b*-axis runs between blue and yellow; the L*-axis describes the brightness (luminance) of the color.

The data of the first color $F_1$ of the optically active zones as well as the data of the at least one second color $F_2$ of the optically inactive zones refer in each case to observation from sides of the external surroundings, i.e., in view through the light-entry-side (front) transparent covering. Thus, the color data refer to the respective color that is present on the outer surface of the light-entry-side covering. The color measurement or the determination of the color coordinates of a color can be done in a simple manner by a commercially available colorimeter (spectral photometer), wherein one and the same instrument is used for the color measurement. The colorimeter is aimed, for this purpose, at the outer surface of the light-entry-side covering, in particular, placed on the outer surface. Common colorimeters enable standardized color measurement, with their structure and tolerances typically subject to international standards, for example, defined by DIN 5033, ISO/CIE 10527, ISO 7724, and ASTM E1347. For example, reference is made with regard to color measurement to the standard DIN 5033 in its entirety. A colorimeter has as a light source, for example, a xenon flash lamp, tungsten halogen lamp, or one or a plurality of LEDs, by which the outer surface of a body is illuminated by the light (e.g., white light) produced and the light received from the solar module is measured. As explained in the introduction, the body's color measured by the colorimeter results from the reflected and re-emitted light.

In the solar module according to the invention, the front covering has on its outer and/or inner surface at least one first dot grid, which (in a perpendicular view of the front covering) (completely) covers at least the optically active zones. For observation of the covering, the optically active zones can be projected (at a right angle) into the plane of the (flat) front covering. The optically active zones of the solar cells or of the inner region of the solar module can be covered (completely) by a single first dot grid, wherein the first dot grid can also extend in particular over optically inactive zones (patterning zones in the case of thin-film solar modules or regions between wafers in the case of silicon wafer modules) between the optically active zones. It is also possible for each optically active zone to be (completely) covered by a separate first dot grid. In this case, the solar module has a plurality of first dot grids. In one embodiment of the invention, a respective first dot grid exactly covers one optically active zone, in other words, the shape and dimensions of the first dot grid are identical to those of the optically active zone. If only one single first dot grid that covers the inner region of the solar module is provided, it is possible for the shape and dimensions of the first dot grid to correspond to those of the inner region of the solar module.

The at least one first dot grid, or each first dot grid, has a large number of opaque colored dots, which have in each case a third color $F_3$ different from the first color $F_1$ of the optically active zone and having the color coordinates $L*_3$, $a*_3$, $b*_3$.

In the solar module according to the invention, the light-entry-side covering has on its outer and/or inner surface at least one second dot grid, which (completely) covers at least one optically inactive zone. For example, the solar module has a second dot grid, which (completely) covers the optically inactive edge region of the solar module. In one embodiment of the invention, the second dot grid exactly covers the optically inactive edge region of the solar module, in other words, the shape and dimensions of the second dot grid are identical to those of the edge region. Additionally, or alternatively, the solar module can have a plurality of second dot grids, wherein each optically inactive intermediate region between the solar cells (patterning zones or regions between wafers in the case of silicon wafer modules) is (completely) covered in each case by a separate second dot grid. In one embodiment of the invention, each second dot grid is situated exactly congruent to the optically inactive intermediate region of the solar module, in other words, the shape and dimensions of the second dot grid are identical to those of the optically inactive intermediate region. Other optically inactive regions are contact tapes or edge decoating zones or edge seals in the case of thin-film solar modules.

The at least one second dot grid, or each second dot grid, has a large number of opaque colored dots, which have in each case a fourth color $F_4$ different from the second color $F_2$ and having the color coordinates $L*_4$, $a*_4$, $b*_4$.

In the context of the present invention, the term "dot grid" refers to an arrangement of a large number of opaque colored dots. Dots directly adjacent one another have a space between them. The arrangement of the colored dots in the dot grid is preferably uniform, in other words, colored dots directly adjacent one another have an equal distance between them. The distance between directly adjacent colored dots can be nonzero, with, in this case, the dot grid also including transparent locations (of the covering) between the opaque colored dots. In the transparent locations between the opaque colored dots, the structure thereunder is discernible through the transparent covering, in other words, the optically active zones as well as the optically inactive zones are discernible in the region of the at least one first dot grid, and the optically inactive zones are discernible in the region of the at least one second dot grid. This gives the covering semitransparency. Although, here, the term "dot" is selected for a single opaque colored element of the dot grid, the shape of a colored dot is not restricted to a circular shape. Instead, an opaque colored dot in the dot grid can, in principle, have any shape and can, for example, be disk-shaped, square, or rectangular. In the context of the invention, the term "dot grid" also includes includes the case in which the distance between directly adjacent opaque colored dots is zero, in other words, a layer of color over the entire surface, wherein the opaque colored dots can no longer be individualized. A full-surface color layer can even be applied, for example, by brushing onto a surface of the light-entry-side covering.

The at least one first and/or at least one second dot grid can be applied on the outer surface and/or inner surface of the light-entry-side covering using a conventional application technique, for example, screenprinting or digital printing. The application of the dot grid on a surface is well known to the person skilled in the art such that it need not be discussed in detail here. Preferably, the at least one first and/or at least one second dot grid are applied on the inner surface of the light-entry-side covering, by which means it is protected from external influences, for example, weathering-related mechanical removal, dust, and grime.

In the at least one first dot grid that covers at least one optically active zone, the distance between immediately adjacent colored dots is always nonzero such that in the region of the first dot grid, there are opaque regions (opaque colored dots of the first dot grid) and optically transparent regions (intermediate regions between the opaque colored dots of the dot grids) of the covering. Accordingly, in the first dot grid, the first color $F_1$ of the optically active zones and the third color $F_3$ of the opaque dots of the first dot grid are added (combined) such that addition in the region of the first dot grid yields, through addition of the first color $F_1$ and of the third color $F_3$, an additive color (combination color) $F_1'$ having the color coordinates $L^*_1{}'$, $a^*_1{}'$, $b^*_1{}'$. Here, an addition (combination) of the two colors $F_1$ and $F_3$ is observed in one region of the first dot grid, which has a size of at least 0.2 cm², in particular at least 0.5 cm², in particular at least 1 cm². In the human eye or colorimeter, with an application-typical distance between the observer and the module of one or a plurality of meters, as a result of the additive color mixing of the two colors $F_1$ and $F_3$, a color impression is acquired, which typically corresponds to an averaged additive color $F_1'$. In the context of the present invention, the terms "addition" or "combination" of colors refers to the overall impression in the human eye or a colorimeter when the colors of an outer surface of the module of at least 0.2 cm² are observed.

According to one embodiment of the solar module according to the invention, in the at least one second dot grid, the distance between directly adjacent dots is nonzero such that also in the region of the second dot grid, there are opaque regions (opaque colored dots of the second dot grid) and optically transparent regions (intermediate regions between the opaque colored dots of the second dot grid) of the front covering. Accordingly, in the second dot grid, with an application-typical distance between the observer and the module of one or a plurality of meters, the at least one second color $F_2$ of the optically inactive regions and the fourth color $F_4$ of the opaque colored dots of the second dot grid are added (combined) such that, in the region of the second dot grid, addition of the second color $F_2$ and the fourth color $F_4$ yields an additive color (combination color) $F_2'$ with the color coordinates $L^*_2{}'$, $a^*_2{}'$, $b^*_2{}'$. Also, for the second dot grid, addition (combination) of the colors $F_2$ and $F_4$ is observed in a region of the second dot grid, which has a size, for example, of at least 0.2 cm², in particular at least 0.5 cm², in particular at least 1 cm². In the human eye or colorimeter, with an application-typical distance between the observer and the module of one or a plurality of meters, as a result of the additive color mixing of the two colors $F_2$ and $F_4$, a color impression is acquired, which typically corresponds to an averaged color $F_2'$.

Analogously to the first color $F_1$ of the optically active zones as well as to the at least one second color $F_2$ of the optically inactive zones, the additive colors $F_1'$ and $F_2'$ refer in each case to an observation of the front surface of the solar module from the external surroundings. If the at least one first dot grid and the at least one second dot grid is applied on the inner surface of the front covering, the data of the third color $F_3$ and fourth color $F_4$ refer in each case to the color in view through the front covering, i.e., the color that is present on the outer surface of the front covering. Correspondingly, the additive colors $F_1'$ and $F_2'$ refer in each case to the color that is present on the outer surface of the front covering. As already stated for the colors $F_1$ and $F_2$, the color coordinates of the additive colors $F_1'$ and $F_2'$ can be determined by a commercially available colorimeter (spectral photometer). The colorimeter is aimed, for this purpose, at the outer surface of the light-entry-side covering and in particular placed on the outer surface of the light-entry-side substrate.

It is essential here for the third color $F_3$ of the at least one first dot grid and the fourth color $F_4$ of the at least one second dot grid to be selected such that distance between the color coordinates of the additive colors $F_1'$ and $F_2'$ is indicated by the formula:

$$\Delta E_{1,2} = \sqrt{(L^*_1{}'-L^*_2{}')^2+(a^*_1{}'-a^*_2{}')^2+(b^*_1{}'-b^*_1{}')^2}$$

the condition $\Delta E_{1,2} \leq 5$ is satisfied.

The formula for $\Delta E_{1,2}$ indicates the color deviation of the additive colors $F_1'$ and $F_2'$, wherein it is determined by the condition $\Delta E_{1,2} \leq 5$ that the color deviation must not exceed a specified maximum size.

As the inventor was able to demonstrate, it can advantageously be achieved by means of the condition $\Delta E_{1,2} \leq 5$ that the the color impression in the region of the optically active zones and the optically inactive zones, in other words, over the complete solar module, has relatively low contrast and, thus, good color homogeneity. It is particularly advantageous for the color deviation to be even smaller, wherein the following is preferably true: $\Delta E_{1,2} \leq 2$, in particular $\Delta E_{1,2} \leq 1$, and in particular $\Delta E_{1,2} \leq 0.5$. In principle, the homogeneity of the color impression of the solar module becomes increasingly better the smaller the color deviation.

The solar module according to the invention thus has, particularly advantageously, over the complete module, low contrast and a very homogeneous color impression resulting from the two additive colors $F_1'$ and $F_2'$, with the additive colors $F_1'$ and $F_2'$ of the optically inactive zones and the optically active zones differing only slightly from one another. Particularly advantageously, the color impression of the solar module presents no or only very slight directional dependency. The dot grids can be produced in a technically simple and economical manner, for example, by screenprinting or digital printing. Advantageously used for this purpose are ceramic (glass) colors that are fired during the thermal treatment of a front covering made of glass.

In an advantageous embodiment of the invention, the opaque colored dots of the at least one first dot grid and/or of the at least one second dot grid have in each case a size of less than 5 mm, in particular less than 3 mm, in particular less than 1 mm. Thus, it can advantageously be achieved that a greater distancing of the observer from the module by a few meters still yields a flat monochromatic color image.

According to an advantageous embodiment of the invention, the at least one first dot grid and/or the at least one second dot grid have in each case a resolution of at least 80 dpi (dots per inch). As a result of this measure, high color homogeneity of the solar module can be achieved. It is particularly advantageous for the opaque colored dots of the at least one first dot grid and/or of the at least one second dot grid to have, in each case, a maximum dimension of less than 0.3 mm, in particular less than 0.2 mm, in particular less than 0.1 mm. Consequently, the maximum dimension of the individual colored dots of the dot grid is smaller than the resolution of the human eye at a distance of 1 to 2 m from the surface of the solar module (i.e., the outer surface of the light-entry-side covering). As a result, particularly good color homogeneity of the solar module can be achieved, satisfying very high aesthetic requirements.

According to an advantageous embodiment of the invention, the light-entry-side covering is made of satinized glass.

These glasses are processed by etching or sandblasting on one or both sides such that there is a high proportion of diffuse reflection and transmittance. Through the use of satinized glass, the dot grids can be partially blurred such that, even with relatively large dots, a homogeneous color impression is created. The diffuse transmittance can be determined by a hazemeter. According to ASTM D1003, haze is the ratio of the diffuse portion to the total transmittance (or, optionally, reflection). Satinized glasses with transmittance-haze greater than 50%, in particular greater than 80%, in particular greater than 90%, are particularly suitable for obtaining a homogeneous color impression from the dot grid behind the satinized front pane.

As already stated in the introduction, in the solar module according to the invention, it is necessary to resolve the conflict of objectives according to which, on the one hand, a homogeneous color impression is to be achieved over the complete solar module but the light-entry-side substrate must have, in the region of the optically active zones, adequate optical transparency to enable photoelectric energy conversion with a level of efficiency that is usable in practice. The distances between directly adjacent opaque colored dots of the at least one first dot grid are consequently always nonzero. According to a particularly advantageous embodiment of the invention, the at least one first dot grid is implemented such that a degree of coverage of the optically active zones is less than 50%, preferably less than 25%, and even more preferably less than 10%. As a result, on the one hand, a homogeneous color effect and, on the other, a high level of efficiency or the least possible loss of efficiency of the solar module can be ensured.

The expression "degree of coverage" describes the percentage share of the opaque colored dots of the at least one first dot grid relative to the area of the optically active zones. For the calculation of the degree of coverage, the coverage of the optically active zones by the opaque dots can be considered in a perpendicular view through the light-entry-side substrate. It would also be conceivable to project the optically active zones into the plane of the light-entry-side covering, in particular into the plane of the at least one first dot grid (perpendicular to the substrate surface).

In the region of the optically inactive zones, it is not necessary for the light-entry-side covering to have high optical transparency. Instead, it is advantageous for the at least one second dot grid to be implemented such that a degree of coverage of the at least one optically inactive zone, in particular of all optically inactive zones, is at least 95%, in particular at least 97%, in particular at least 99%. Thus, advantageously, a virtually opaque covering with a homogeneous color impression of the optically inactive zones, which are typically very inhomogeneous and different from one another in terms of color, can be achieved. This is true in particular for the edge region of the solar module which is very inhomogeneous in terms of structure and color. The color share of the optically inactive zones in the second additive color $F_2'$ is thus relatively low or zero such that, overall, a very high color homogeneity can be achieved over the complete module.

According to one embodiment of the invention, the at least one second dot grid is implemented such that a degree of coverage of the at least one optically inactive zone, in particular of all optically inactive zones, is 100%. This means that the second dot grid is a full-surface color coat without distance between the opaque dots. Individual colored dots of the second dot grid are then no longer discernible. In this case, the additive color $F_2'$ having the color coordinates $L^*_2', a^*_2', b^*_2'$ corresponds to the fourth color $F_4$ having the color coordinates $L^*_4, a^*_4, b^*_4$, since addition with the background color is no longer possible. This measure has the advantage that very good color homogeneity can be achieved over the complete module, in particular in the edge region of the solar module, which is inhomogeneous in terms of structure and color.

According to an alternative embodiment of the invention, it is also possible for the at least one second dot grid to be implemented such that a degree of coverage of the at least one optically inactive zone, in particular of all optically inactive zones, is less than 95%. In this case, by matching the at least one second additive color $F_2'$ to the first additive color $F_1'$, good color homogeneity of the solar module can be achieved. This embodiment can be advantageous in modules with silicon wafers. For the most part, a white back film is situated in the region between the wafers. This can be covered by a second dot grid with a lower degree of coverage. Thus, light that arrives at the cell through internal reflection and total reflection can still be coupled in in this region.

Analogously to the degree of coverage of the optically active zones, the expression "degree of coverage" describes the percentage share of the opaque colored dots of the at least one second dot grid relative to the area of the optically inactive zones. For the calculation of the degree of coverage, the coverage of the optically inactive zones by the opaque dots can be considered in a perpendicular view through the light-entry-side covering. It would also be possible to project the optically inactive zones into the plane of the light-entry-side covering, in particular into the plane of the at least one second dot grid (perpendicular to the substrate surface).

The invention further relates to a method for producing a solar module according to the invention, as described above. A front covering of the solar module is provided and applied on the outer surface and/or inner surface of the front covering:

at least one first dot grid that covers at least the optically active zones, wherein the first dot grid has a large number of opaque colored dots that have a third color $F_3$ different from the first color $F_1$ and having the color coordinates $L^*_3, a^*_3, b^*_3$, wherein addition of the first color $F_1$ and the third color $F_3$ yields an additive color $F_1'$ having the color coordinates $L^*_1', a^*_1', b^*_1'$, at least one second dot grid that covers at least one optically inactive zone, wherein the second dot grid has a large number of opaque colored dots which have a fourth color $F_4$ different from the second color $F_2$ and having the color coordinates $L^*_4, a^*_4, b^*_4$, wherein addition of the second color $F_2$ and the fourth color $F_4$ yields an additive color $F_2'$ having the color coordinates $L^*_2', a^*_2', b^*_2'$, wherein the third color $F_3$ and the fourth color $F_4$ are selected such that for $$\Delta E_{1,2} = \sqrt{(L^*_1' - L^*_2')^2 + (a^*_1' - a^*_2')^2 + (b^*_1' - b^*_2')^2}$$

the condition $\Delta E_{1,2} \leq 5$ is satisfied.

The first and/or second dot grid is applied on the front substrate, for example, by screenprinting or digital printing. In the case of a full-surface color coating of the at least one second dot grid, the dot grid can even be spread on the outer and/or inner surface of the front substrate, for example.

The invention further relates to the use of the solar module according to the invention as part of a building envelope, in particular as a window, façade, or roof component.

The various embodiments of the invention can be realized individually or in any combinations. In particular, the features mentioned above and hereinafter can be used not only in the combinations indicated but also in other combinations or in isolation without departing from the scope of the present invention.

The invention is now explained in detail using an exemplary embodiment, referring to the accompanying figures. They depict, in simplified, not to scale representation.

DETAILED DESCRIPTION OF THE DRAWINGS

Figure 1:
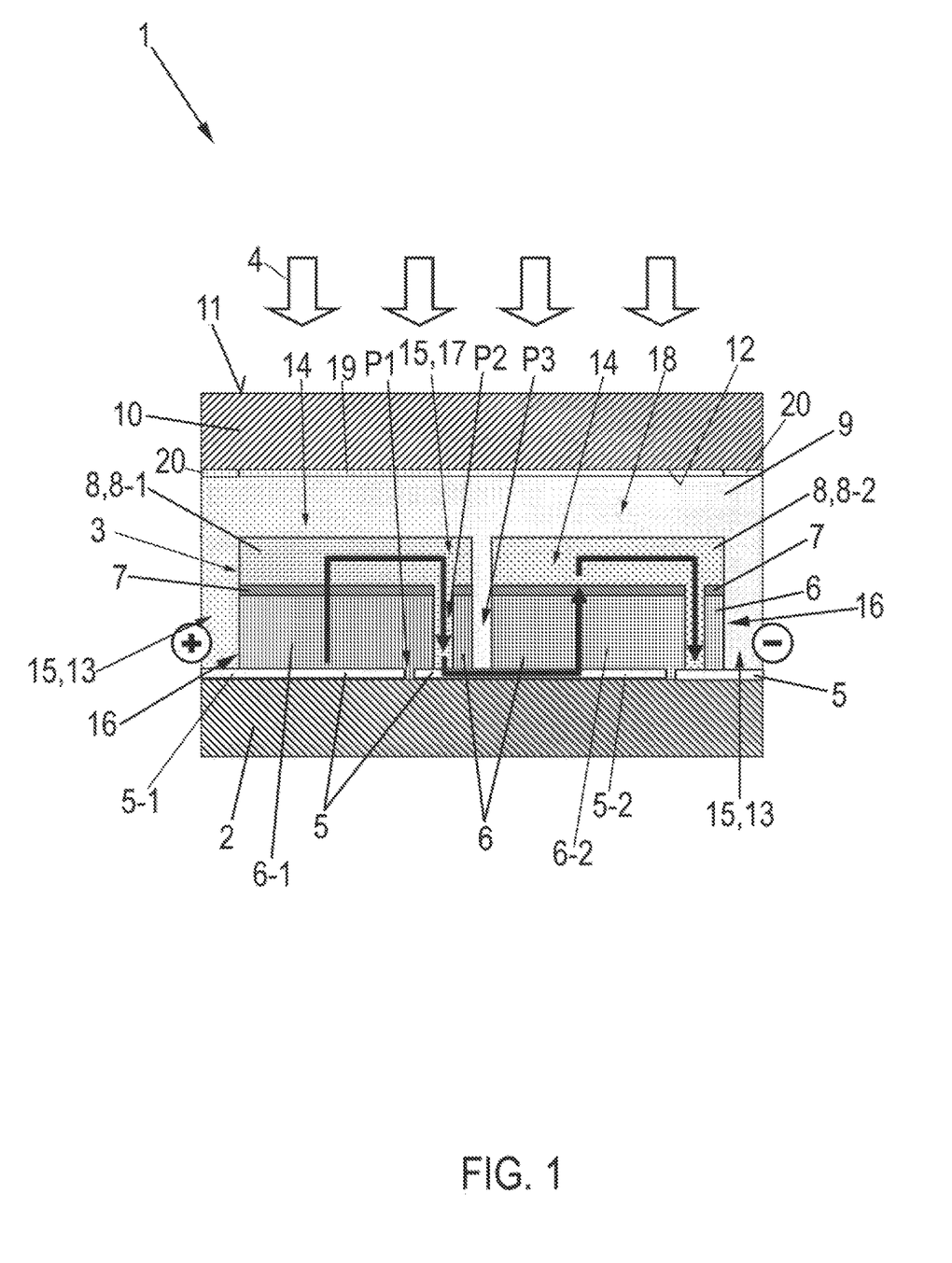
FIG. 1 a schematic representation of the integrated serial connection of solar cells according to one embodiment of a solar module according to the invention implemented in the form of a thin-film solar module in a cross-sectional view.

FIG. 1 schematically illustrates a thin-film solar module according to the present invention referenced as a whole with the number 1 using a cross-sectional view (section perpendicular to the module surface). The thin-film solar module 1 comprises a plurality of solar cells 16 serially connected to one another in integrated form, wherein, in a greatly simplified manner, only two solar cells 16 are depicted. Of course, generally speaking, in the thin-film solar module 1, a large number of solar cells 16 (for example, approx. 100 to 150) are serially connected.

The thin-film solar module 1 has a composite pane structure in substrate configuration. It comprises a back substrate 2 with a layer structure 3 made of thin films applied thereon, wherein the layer structure 3 is arranged on a light-entry-side surface of the back substrate 2. The back substrate 2 is implemented here, for example, as a rigid flat glass plate with relatively high light permeability, wherein other electrically insulating materials with desired stability and inert behavior relative to the process steps performed can equally be used.

The layer structure 3 includes, arranged on the light-entry-side surface of the back substrate 2, an opaque back electrode layer 5 that is made, for example, of a light-impermeable metal such as molybdenum (Mo) and was applied on the back substrate 2 by vapor deposition or magnetron enhanced cathodic sputtering (sputtering). The back electrode layer 5 has, for example, a layer thickness in the range from 300 nm to 600 nm.

A photovoltaically active (opaque) absorber layer 6 made of a semiconductor doped with metal ions whose band gap is capable of absorbing the greatest possible share of sunlight is applied on the back electrode layer 5. The absorber layer 6 is made, for example, of a p-conductive chalcopyrite semiconductor, for example, a compound of the group $Cu(In/Ga)(S/Se)_2$, in particular sodium(Na)-doped $Cu(In/Ga)(S/Se)_2$. In the above formula, indium (In) and gallium (Ga) as well as sulfur (S) and selenium (Se) can be present alternatively or in combination. The absorber layer 6 has a layer thickness that is, for example, in the range from 1-5 μm and is, in particular, approx. 2 μm. For the production of the absorber layer 6, various material layers are typically applied, for example, by sputtering, which layers are subsequently thermally converted to form the compound semiconductor by heating in a furnace, optionally in an atmosphere containing S and/or Se (RTP=rapid thermal processing). This manner of production of a compound semiconductor is well known to the person skilled in the art such that it need not be discussed in detail here.

Deposited on the absorber layer 6 is a buffer layer 7, which consists here, for example, of a single layer of cadmium sulfide (CdS) and a single layer of intrinsic zinc oxide (i-ZnO), not depicted in detail in FIG. 1.

A front electrode layer 8 is applied on the buffer layer 7, for example, by sputtering. The front electrode layer 8 is transparent to radiation in the visible spectral range ("window electrode") such that the incoming sunlight 4 (symbolized in FIG. 1 by four parallel arrows) is weakened only slightly. The front electrode layer 8 is based, for example, on a doped metal oxide, for example, n-conductive aluminum (Al)-doped zinc oxide (ZnO). Such a front electrode layer 8 is generally referred to as a TCO layer (TCO=transparent conductive oxide). The layer thickness of the front electrode layer 8 is, for example, approx. 500 nm. By means of the front electrode layer 8, together with the buffer layer 7 and the absorber layer 6, a heterojunction (in other words, a succession of layers of the opposite conductor type) is formed. The buffer layer 7 can effect electronic adaptation between the absorber layer 6 and the front electrode layer 8.

For protection against environmental influences, a (plastic) adhesive layer 9, which serves to encapsulate the layer structure 3, is applied on the front electrode layer 8. Glued with the adhesive layer 9 is a front or light-entry-side covering 10 transparent to sunlight, implemented, for example, in the form of a rigid (planar) glass plate made of extra white glass with low iron content. The front covering 10 is used for sealing and for mechanical protection of the layer structure 3. The front covering 10 has two opposite surfaces, namely, an inner surface 12 facing the solar cells 16 and an outer surface 11 facing away from the solar cells 16, which is, at the same time, the module surface. The thin-film solar module 1 can absorb sunlight 4 via the outer surface 11 in order to produce electrical voltage on the two voltage connections (+,−). A resulting current path is depicted in FIG. 1 by arrows arranged in series. The front covering 10 and the back substrate 2 are fixedly bonded to one another ("laminated"), with the adhesive layer 9 implemented here, for example, as a thermoplastic adhesive layer that is plastically deformable by heating and, upon cooling, fixedly bonds the covering 10 and the substrate 2 to one another. Here, the adhesive layer 9 is made, for example, of PVB. The covering 10 and the substrate 2 form a laminated composite together with the solar cells 16 embedded in the adhesive layer 9.

For the implementation and serial connection of the solar cells 16, the layer structure 3 was patterned using a suitable patterning technology, for example, laser scribing and/or mechanical ablation. Typically, for this purpose, direct successions of, in each case, three patterning lines P1-P2-P3 are introduced into the layer structure 3. Here, at least the back electrode layer 5 is subdivided by first patterning lines P1, producing the back electrodes 5-1, 5-2, of the solar cells 16. At least the absorber layer 6 is subdivided by second patterning lines P2, producing the absorbers 6-1, 6-2 of the solar cells 16. At least the front electrode layer 8 is subdivided by third patterning lines P3, producing the front electrodes 8-1, 8-2 of the solar cells 16.

The front electrode 8-1 of one solar cell 16 is electrically connected to the back electrode 5-2 of an adjacent solar cell 16 via the second structuring line P2, with the front electrode 8-1, for example, directly contacting the back electrode 5-2. In the exemplary embodiment depicted, the trenches of the first patterning lines P1 are filled with material of the absorber layer 6. The trenches of the second patterning lines P2 are filled by material of the front electrode layer 8, and the trenches of the third patterning lines P3 are filled by the adhesive layer 9. Each direct succession of a first, second, and third patterning line Pl-P2-P3 forms a patterning zone 17. FIG. 1 depicts, by way of example, only one single patterning zone 17, by which the serial connection of two directly adjacent solar cells 16 is defined, with a large number of such patterning zones 17 provided for patterning and serially connecting solar cells 16 in the thin-film solar module 1.

The optically active zones of the thin-film solar module 1 are identified in FIG. 1 by the reference number "14". These are those regions of the solar cells 16 that have in each case, positioned atop one another in the form of a stack, a back electrode and an absorber as well as a front electrode and are capable of photoelectric conversion of sunlight 4 into electric current. For example, the optically active zone 14 of the solar cell 16 depicted on the left in FIG. 1 comprises the back electrode 5-1, the absorber 6-1, and the front electrode 7-1.

The thin-film solar module 1 includes an inner region 18 that has the solar cells 16 and an edge region 13. The solar cells 16 in the inner region 18 comprise the optically active zones 14 and the optically inactive patterning zones 17. The optically inactive region 13 (completely) surrounds the inner region 18 peripherally. In the edge region 13, the layer structure 3 is removed. The edge region 13 serves, in particular, for the electrical contacting of the serially connected solar cells 16 by busbars (not shown). In FIG. 1, the optically inactive zones of the thin-film solar module (edge region 13, patterning zones 17) are identified by the reference number "15".

Figure 2:
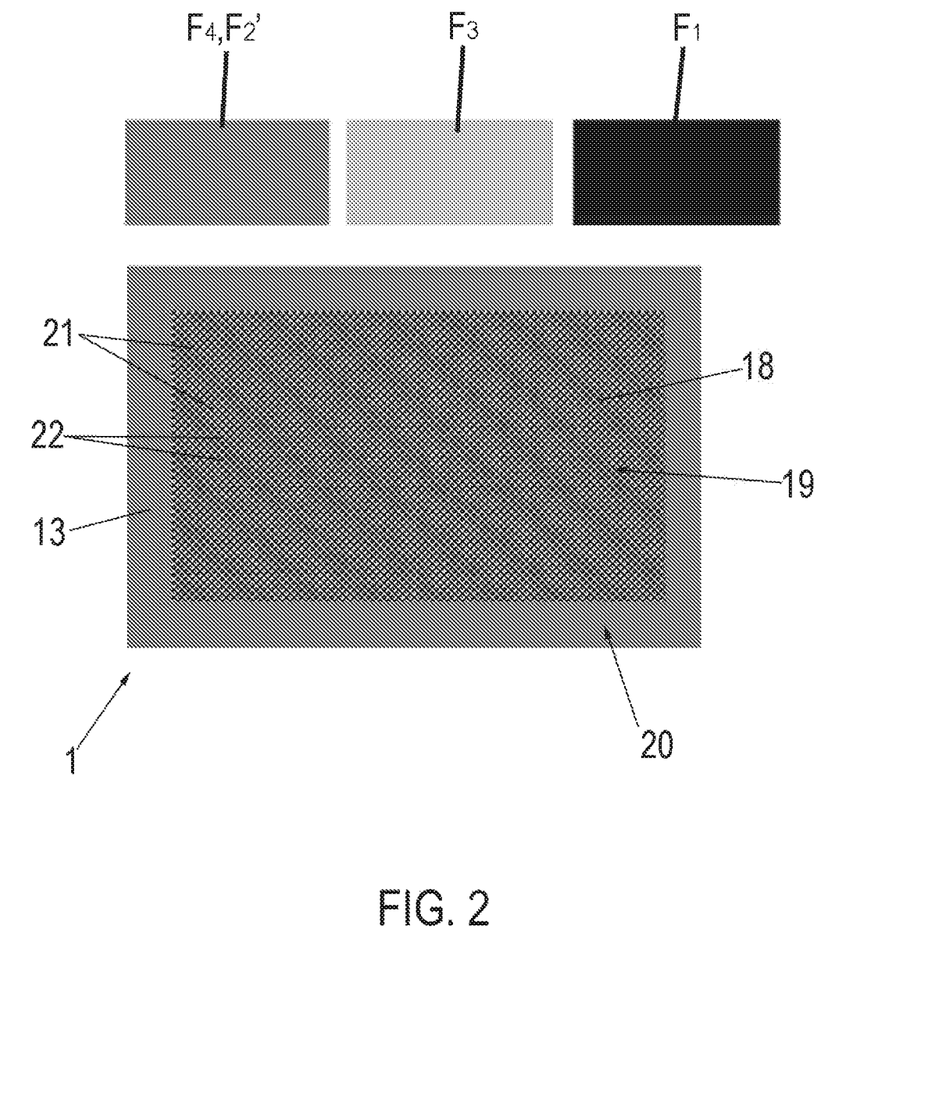
FIG. 2 a schematic representation of the light-entry-side surface of the thin-film solar module of FIG. 1 viewed from above.

Reference is now made to FIG. 2 which schematically illustrates an exemplary embodiment of the light-entry-side surface of the thin-film solar module 1 of FIG. 1. According to it, a first dot grid 19 and a second dot grid 20 are applied on the inner surface 12 of the front covering 10. Viewed at a right angle through the front covering 10, i.e., relative to a direction perpendicular to the outer surface 11, the first dot grid 19 completely covers the inner region 18 of the thin-film solar module 1, i.e., the first dot grid 19 arranged only above or over the inner region 18. The shape and dimensions of the first dot grid 19 correspond to those of the inner region 18. Viewed at a right angle through the front covering 10, i.e., relative to the direction perpendicular to the outer surface 11, the second dot grid 20 completely covers the edge region 13 of the thin-film solar module 1, with the second dot grid 20 arranged only over the edge region 13. The shape and dimensions of the second dot grid 19 correspond to those of the edge region 13. As indicated in FIG. 2, the first dot grid 19 and the second dot grid 20 are discernible in each case from the external surroundings through the front transparent covering 10.

The first dot grid 19 is composed of a large number of opaque colored dots 21 that are arranged in the form of a checkerboard pattern with equal distances therebetween. Situated between the opaque colored dots 21 are transparent locations 22 of the front covering 10 such that the optically active zones 14 are discernible through the front covering 10. The first dot grid 19 has a resolution of at least 80 dpi, with the individual colored dots 21 having in each case a maximum dimension of less than 0.3 mm. The degree of coverage of the optically active zones 14 by the colored dots 21 of the first dot grid 19 is 50% (area share of the colored dots 21), in other words, with a perpendicular view through the front covering 10 or (perpendicular) projection of the optically active zones 14 on the inner surface 11, the opaque colored dots 21 of the first dot grid 19 occupy 50% of the area of the optically active zones 14. Situated in the remaining region of the optically active zones 14 are transparent locations 22. Correspondingly, the optical (semi-)transparency of the front covering 10 in the inner region 18 is 50%. As a result, the loss of efficiency due to reduction of the optical transparency of the front covering 10 can be minimized.

The second dot grid 20 is analogously composed of a large number of opaque colored dots 21, with the degree of coverage of the optically inactive edge region 13 at least 95%, in other words, with a perpendicular view through the front covering 10 or (perpendicular) projection of the edge region 13 the inner surface 11, the colored dots 21 of the second dot grid 20 occupy at least 95% of the area of the edge region 13. The colored dots 21 have a correspondingly small distance between them such that they are no longer discernible as individual colored dots 21 in FIG. 2. Instead, the second dot grid 20 substantially corresponds to a full-surface color coating. Consequently, the edge region 13 is virtually no longer discernible through the front covering 10, with the optical transparency of the front covering 10 in the edge region 13 amounting to a maximum of 5% (in other words, opaque covering 10 in the edge region 13).

In FIG. 1, the two dot grids 19, 20 are schematically depicted (with greatly enlarged layer thickness of the print for better identification).

In FIG. 2, the various colors of the thin-film solar module are depicted by way of example using gray tones. The optically active zones 14 have (due to production conditions) a first color $F_1$ that is defined by the color coordinates $L^*_1, a^*_1, b^*_1$. The opaque colored dots 21 of the first dot grid 19 have a third color $F_3$ different from the first color $F_1$ and having the color coordinates $L^*_3, a^*_3, b^*_3$. Since the first color $F_1$ is visible through the transparent locations 22, the first color $F_1$ and the third color $F_3$ are added in the inner region 18 of the thin-film solar module 1 to yield an additive color $F_1'$ with the color coordinates $L^*_1{}', a^*_1{}', b^*_1{}'$. Viewed on the front covering 10, in other words, for a viewer observing the thin-film solar module 1 from the external surroundings, there is, thus, a color impression in the inner region 18 that corresponds to an addition (additive color mixing) of the two colors $F_1$ and $F_3$ to form the additive color $F_1'$. Thus, there is, for the viewer, an averaged color impression from the background color of the optically active zones 14 and the color of the opaque colored dots 21 of the first dot grid 19. The additive color $F_1'$ can be determined in a simple manner by a conventional colorimeter (spectral photometer), which is placed for this purpose, for example, with a measuring aperture on the outer surface of the front covering 10. Also possible would be a measurement of the additive color $F_1'$ at a distance of, for example, 1 to 2 m from the outer surface 11. It is essential here that for an addition of the two colors $F_1$ and $F_3$ to form the additive color $F_1'$, a region of the outer surface 11 of the front covering 10 with a size of at least 0.2 cm² is considered.

In the edge region 13, the thin-film solar module 1 has (due to production conditions) a second color $F_2$ different from the first color $F_1$ and defined by the color coordinates $L^*_2, a^*_2, b^*_2$. In FIG. 2, the second color $F_2$ is no longer discernible through the second dot grid 20 applied substantially over the entire surface. The opaque colored dots 21 of the second dot grid 20 have a fourth color $F_4$, different from the second color $F_2$ and defined by the color coordinates $L^*_4, a^*_4, b^*_4$. In the edge region 13, the second color $F_2$ and the fourth color $F_4$ are thus added to yield an additive color $F_2'$, defined by the color coordinates $L^*_4{}', a^*_4{}', b^*_4{}'$. As a result of the very low optical transparency in the edge region 13, the additive color $F_2'$ corresponds substantially to the fourth color $F_4$ of the opaque colored dots 21 of the second dot grid 20. Accordingly, there is, viewed on the front covering 10, i.e., for a viewer observing the thin-film solar module 1 from the external surroundings, a color impression in the edge region 13 that corresponds to the additive color $F_2'$, i.e., substantially to the fourth color $F_4$ of the opaque colored dots 21.

In the production of the two dot grids 19, 20, the third color $F_3$ and the fourth color $F_4$ are selected such that for the color distance resulting from the formula $$\Delta E_{1,2}=\sqrt{(L*_1{'}-L*_2{'})^2+(a*_1{'}-a*_2{'})^2+(b*_1{'}-b*_1{'})^2}$$

the condition $\Delta E_{1,2} \leq 5$ is satisfied.

In practice, in the selection of the colors, the fourth color $F_4$ of the second dot grid 20 can be selected such that there is the least possible contrast with the third color $F_3$ of the colored dots 21 of the first dot grid 19. Typically, the fourth color $F_4$ of the second dot grid 20 is darker than the third color $F_3$. As a practical manner, starting with a suitably covering fourth color $F_4$ of the second dot grid 20, the lightest possible third color $F_3$ is then selected. In the case of cell areas with residual coloration, their color should be taken into account during the color mixing. If the resolution of the opaque colored dots 21 is relatively small, then the contrast between the third color $F_3$ of the opaque colored dots 21 of the first dot grid 19 and of the first color $F_1$, in other words, the background color, of the cell areas (i.e., optically active zones 14) should not be too great, as a result of which, however, the required degree of coverage and, thus, the loss of efficiency can increase. In the case of higher resolution, homogeneous color adaptation, even with strong contrasts between opaque colored dots and darker cell areas can be achieved.

In the exemplary embodiment of FIG. 2 the ratio of the L* values of the light dots of the first dot grid 19 to the L* values of the dots of the second dot grid 20 in the edge region 13 at 50% coverage to black is approx. 1.4:1. Thus, a sharp contrast between the colors in the edge region 13 and the inner region 18 can be avoided. The overall color impression (for example, from a distance of 1 m) from opaque colored dots 21 and transparent locations 22 in the inner region 18 is as close as possible to the color impression of the optically inactive zone 15 in the edge region 13; in other words, the additive color mixing of the opaque colored dots 21 (color $F_3$) and the residual reflection of the cell areas (color $F_1$) yield a color $F_1'$, whose brightness, tone, and saturation deviate in each case less than 5% relatively (preferably 2%, better yet 1%) from the brightness, tone, and saturation of the fourth color $F_4$ (corresponds substantially to the second additive color $F_2'$) over the optically inactive zone 15 in the edge region 13.

For the selection of the right colors, the person skilled in the art has access to various techniques and methods that are not the subject matter of this invention. For two cases, this is to be illustrated at this point only by way of example and in a simplified manner. The RGB color space is to be used here for the calculation of the colors. Tables or programs are available for the conversion of CIE-L*a*b* into RGB.

Case 1: The active cell area is virtually black ($F_1$ in RGB=(0,0,0)) as can nearly be achieved with thin-film solar modules based on $Cu(In,Ga)(S,Se)_2$ under suitable processing conditions. The desired color of the module $F_1'$ is gray, for example, RGB (64,64,64). For the least possible coverage with the first dot grid, white (256, 256, 256) must thus be used as color $F_3$. The degree of coverage of the first dot grid is thus calculated at 25%. Then, for the edge covering, with 100% coverage of the second dot grid, the color $F_4=F_2'=F_1'=(64,64,64)$ can be selected.

Case 2: A customer wants a blue module with the RGB color code (0,50,114). The active area is black (RGB 0,0,0). The edge covering should, because of the metallic contact bands, be as opaque as possible; thus, a degree of coverage of 100% is desired for the second dot grid. In order to achieve the least possible coverage in the active cell area, the color $F_3$ of the dots of the first grid must have the brightest possible tone. However, the brightness and saturation of the color must not change. Limiting is the brightest color coordinate, here in RGB, consequently, blue (114). The maximum blue value is 256 in the RGB color space. The maximum coverage is thus 114/256=44%. For the RGB color code of the color $F_3$ of the individual points, $F_3$=(0, 113, 256) is then obtained.

Although this is not depicted in the exemplary embodiment of FIG. 2, it would be equally possible to provide a second dot grid 20 in each case (completely) covering the patterning zone 17. This can improve the color homogeneity of the thin-film solar module 1 even further.

Figure 3:
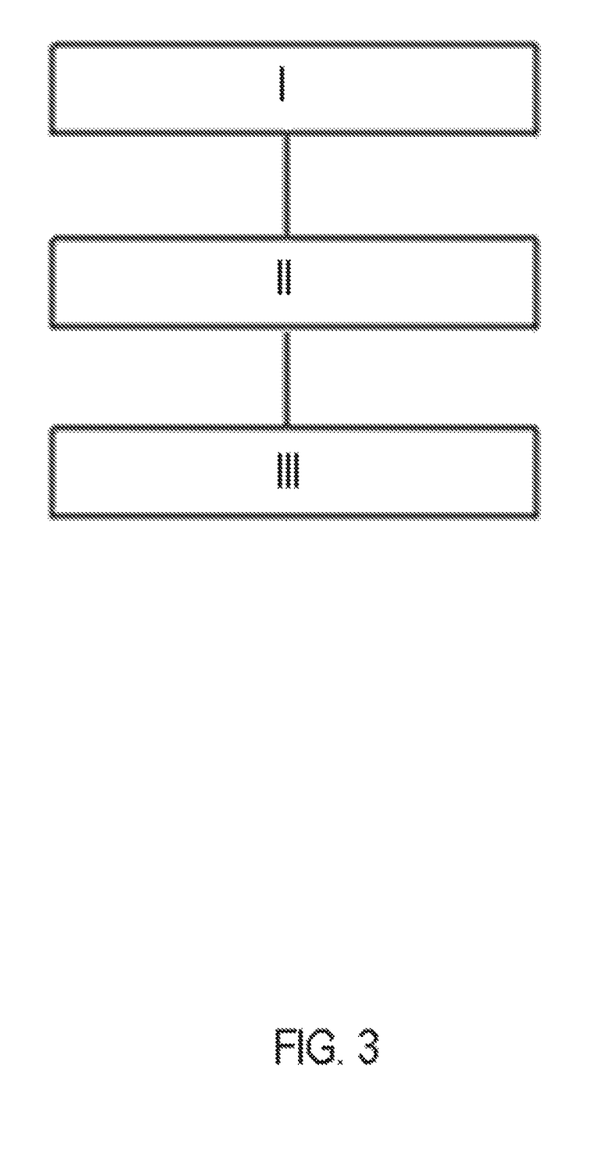
FIG. 3 a flowchart to illustrate the method according to the invention.

Reference is now made to FIG. 3, in which an exemplary embodiment of the method according to the invention is illustrated. The method comprises a first step I, wherein a front covering 10 with an outer surface 11 facing the external surroundings and an inner surface 12 facing the solar cells 16 is provided. In a second step II, at least one first dot grid 19 that covers at least the optically active zones 14 of the solar cells 16 is applied on the inner surface 12 and/or the outer surface 11 of the front covering 10. The first dot grid 19 has a large number of opaque colored dots 21, which have a third color $F_3$ different from the first color $F_1$ of the optically active zones 14 and having the color coordinates $L*_3$, $a*_3$, $b*_3$, wherein addition of the first color $F_1$ and the third color $F_3$ yields an additive color $F_1'$ having the color coordinates $L*_1'$, $a*_1'$, $b*_1'$. In a third step III, at least one second dot grid 20 that covers the optically inactive zones 15 is applied on the inner surface 12 and/or the outer surface 11 of the light-entry-side covering 10. The second dot grid 2 has a large number of opaque colored dots 21 that have a fourth color $F_4$ different from the second color $F_2$ and having the color coordinates $L*_4$, $a*_4$, $b*_4$, wherein addition of the second color $F_2$ and the fourth color $F_4$ yields an additive color $F_2'$ having the color coordinates $L*_2'$, $a*_2'$, $b*_2'$. The third color $F_3$ and the fourth color $F_4$ are selected such that for the color distance $$\Delta E_{1,2}=\sqrt{(L*_1{'}-L*_2{'})^2+(a*_1{'}-a*_2{'})^2+(b*_1{'}-b*_1{'})^2}$$

the condition $\Delta E_{1,2} \leq 5$ is satisfied.

The first dot grid 19 and the second dot grid 20 are applied on the front covering 10 using, for example, the screenprinting or digital printing method.

The invention makes available an improved solar module as well as a method for production thereof, which avoids a sharp contrast between optically active and optically inactive zones. Advantageously, the solar module gives a very homogeneous color impression over the complete module with little or no directional dependency of the color impression. The relatively low rate of coverage of the at least one dot grid in the inner region of the solar module enables minimizing the efficiency loss of the solar module.

LIST OF REFERENCE CHARACTERS 1 thin-film solar module
2 back substrate
3 layer structure 4 sunlight
5 back electrode layer
5-1, 5-2 back electrode
6 absorber layer
6-1, 6-2 absorber
7 buffer layer
8 front electrode layer
8-1, 8-2 front electrode
9 adhesive layer
10 front covering
11 outer surface
12 inner surface
13 edge region
14 optically active zone
15 optically inactive zone
16 solar cell
17 patterning zone
18 inner region
19 first dot grid
20 second dot grid
21 colored dot
22 transparent location

The invention claimed is:

1. A solar module with solar cells for photovoltaic energy generation, comprising:
 a front covering with an outer surface facing external surroundings and an inner surface facing the solar cells;
 optically active zones having a first color $F_1$ with color coordinates $L^*_1$, $a^*_1$, $b^*_1$; and
 optically inactive zones having at least one second color $F_2$, different from the first color $F_1$, with color coordinates $L^*_2$, $a^*_2$, $b^*_2$;
 wherein the outer surface and/or the inner surface of the front covering comprise:
  at least one first dot grid that covers at least the optically active zones, wherein the at least one first dot grid has a large number of opaque colored dots having a third color $F_3$, different from the first color $F_1$, with color coordinates $L^*_3$, $a^*_3$, $b^*_3$, wherein addition of the first color $F_1$ and the third color $F_3$ yields an additive color $F_1'$ with color coordinates $L^*_1{}'$, $a^*_1{}'$, $b^*_1{}'$, and
  at least one second dot grid that covers at least one of the optically inactive zones, wherein the at least one second dot grid has a plurality of opaque colored dots having a fourth color $F_4$, different from the second color $F_2$, with color coordinates $L^*_4$, $a^*_4$, $b^*_4$, wherein addition of the second color $F_2$ and the fourth color $F_4$ yields an additive color $F_2'$ with color coordinates $L^*_2{}'$, $a^*_2{}'$, $b^*_2{}'$, and
 wherein the third color $F_3$ and the fourth color $F_4$ are selected such that a condition $\Delta E_{1,2} \leq 5$ is satisfied for color deviation $$\Delta E_{1,2} = \sqrt{(L_1^{*'} - L_2^{*'})^2 + (a_1^{*'} - a_2^{*'})^2 + (b_1^{*'} - b_2^{*'})^2}.$$

2. The solar module according to claim 1, wherein the third color $F_3$ and the fourth color $F_4$ are selected such that for the color deviation $\Delta E_{1,2}$ the condition $\Delta E_{1,2} \leq 2$, $\Delta E_{1,2} \leq 1$, or $\Delta E_{1,2} \leq 0.5$ is satisfied.

3. The solar module according to claim 1, wherein the opaque colored dots of the at least one first dot grid and/or of the at least one second dot grid have a size selected from the group consisting of less than 5 mm, less than 3 mm, and less than 1 mm.

4. The solar module according to claim 1, wherein the at least one first dot grid and/or the at least one second dot grid have a resolution of at least 80 dpi and the opaque colored dots of the first dot grid and/or second dot grid have a maximum dimension selected from less than 0.3 mm, less than 0.2 mm, and less than 0.1 mm.

5. The solar module according to claim 1, wherein the at least one first dot grid is configured such that a degree of coverage of the optically active zones is selected from less than 50%, less than 25%, less than 10%.

6. The solar module according to claim 1, wherein the at least one second dot grid is configured such that a degree of coverage of the at least one optically inactive zone or all optically inactive zones is selected from at least 95%, at least 97%, and at least 99%.

7. The solar module according to claim 1, wherein the at least one second dot grid is configured such that a degree of coverage of the at least one optically inactive zone or all optically inactive zones is 100%, wherein the additive color $F_2'$ with the color coordinates $L^*_2{}'$, $a^*_2{}'$, $b^*_2{}'$ corresponds to the fourth color $F_4$ with the color coordinates $L^*_4$, $a^*_4$, $b^*_4$.

8. The solar module according to claim 1, wherein the at least one second dot grid is configured such that a degree of coverage of the at least one optically inactive zone or all optically inactive zones is less than 95%.

9. The solar module according to claim 1, wherein the at least one first dot grid covers an inner region of the solar module.

10. The solar module according to claim 1, wherein the at least one second dot grid covers an optically inactive edge zone of the solar module.

11. The solar module according to claim 1, wherein optically inactive zones in the inner region are each covered by a second dot grid.

12. The Solar module according to claim 1, wherein the at least one first dot grid and the at least one second dot grid are arranged on the inner surface of the front covering.

13. The solar module according to claim 1, wherein the front covering is made of satinized glass with a haze value selected from greater than 50%, greater than 80%, and greater than 90%.

14. A method for producing a solar module for photovoltaic energy generation, comprising:
 providing a front covering with an outer surface facing external surroundings and an inner surface facing the solar cells;
 providing solar cells with optically active zones having a first color $F_1$ with color coordinates $L^*_1$, $a^*_1$, $b^*_1$, and with optically inactive zones having at least one second color $F_2$, different from the first color $F_1$, with color coordinates $L^*_2$, $a^*_2$, $b^*_2$;
 applying on the outer surface and/or the inner surface of the front covering:
  at least one first dot grid that covers at least the optically active zones, wherein the at least one first dot grid has a large number of opaque colored dots having a third color $F_3$, different from the first color $F_1$, with color coordinates $L^*_3$, $a^*_3$, $b^*_3$, wherein addition of the first color $F_1$ and of the third color $F_3$ yields an additive color $F_3'$ with color coordinates $L^*_1{}'$, $a^*_1{}'$, $b^*_1{}'$, and
  at least one second dot grid that covers at least one of the optically inactive zones, wherein the at least one second dot grid has a plurality of opaque colored dots having a fourth color $F_4$, different from the second color $F_2$, with color coordinates $L^*_4$, $a^*_4$, $b^*_4$, wherein addition of the second color $F_2$ and the fourth color $F_4$ yields an additive color $F_2'$ with color coordinates $L^*_2{}'$, $a^*_2{}'$, $b^*_2{}'$; and selecting the third color $F_3$ and the fourth color $F_4$ such that a condition $\Delta E_{1,2} \leq 5$ is satisfied for color deviation $$\Delta E_{1,2} = \sqrt{(L_1^{*\prime} - L_2^{*\prime})^2 + (a_1^{*\prime} - a_2^{*\prime})^2 + (b_1^{*\prime} - b_2^{*\prime})^2}.$$

15. A building component comprising the solar module of claim 1.

16. The building component of claim 15, selected from the group consisting of a window, a façade, and a roof component.

* * * * *